United States Patent
Xu et al.

(10) Patent No.: US 7,983,043 B2
(45) Date of Patent: Jul. 19, 2011

(54) HEAT DISSIPATION DEVICE

(75) Inventors: Shou-Biao Xu, Shenzhen (CN); Guo Chen, Shenzhen (CN); Shi-Wen Zhou, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 72 days.

(21) Appl. No.: 12/508,582

(22) Filed: Jul. 24, 2009

(65) Prior Publication Data

US 2010/0238630 A1   Sep. 23, 2010

(30) Foreign Application Priority Data

Mar. 20, 2009   (CN) .......................... 2009 1 0300981

(51) Int. Cl.
*H05K 7/20* (2006.01)
*G06F 1/20* (2006.01)

(52) U.S. Cl. .............. 361/700; 361/679.47; 361/679.52; 361/679.54; 361/703; 361/704; 361/709; 361/710; 361/719; 165/80.2; 165/185; 174/15.2; 174/16.3

(58) Field of Classification Search ............ 361/679.46–697.47, 700, 703–704, 709–710, 718–719; 165/80.2–80.3, 104.33, 185; 174/15.2, 16.1, 174/16.3

See application file for complete search history.

(56) References Cited

U.S. PATENT DOCUMENTS

| | | | | |
|---|---|---|---|---|
| D450,306 S | * | 11/2001 | Lin et al. | D13/179 |
| D464,939 S | * | 10/2002 | Chuang et al. | D13/179 |
| D509,483 S | * | 9/2005 | Watanabe et al. | D13/179 |
| 7,231,964 B2 | * | 6/2007 | Hsieh | 165/122 |
| 7,292,443 B1 | * | 11/2007 | Lai et al. | 361/704 |
| 7,331,756 B2 | * | 2/2008 | Watanabe et al. | 415/191 |
| 7,423,877 B2 | * | 9/2008 | Zhou et al. | 361/700 |
| 7,433,194 B2 | * | 10/2008 | Wu et al. | 361/719 |
| D593,512 S | * | 6/2009 | Lin | D13/179 |
| 7,576,987 B2 | * | 8/2009 | Lai et al. | 361/704 |
| 7,802,616 B2 | * | 9/2010 | Chen et al. | 165/104.33 |
| 2008/0055854 A1 | * | 3/2008 | Zhou et al. | 361/700 |
| 2008/0094800 A1 | * | 4/2008 | Chen et al. | 361/704 |
| 2008/0128110 A1 | * | 6/2008 | Lai et al. | 165/80.3 |
| 2008/0151507 A1 | * | 6/2008 | Wu et al. | 361/719 |
| 2009/0161313 A1 | * | 6/2009 | Cheng et al. | 361/679.52 |
| 2009/0244844 A1 | * | 10/2009 | Liao et al. | 361/697 |
| 2009/0262505 A1 | * | 10/2009 | Lin | 361/709 |
| 2009/0288806 A1 | * | 11/2009 | Lin | 165/80.3 |
| 2010/0132918 A1 | * | 6/2010 | Lin | 165/80.3 |
| 2010/0134978 A1 | * | 6/2010 | Lin | 361/697 |

FOREIGN PATENT DOCUMENTS

CN       1581471 A    *  2/2005

\* cited by examiner

*Primary Examiner* — Robert J Hoffberg
(74) *Attorney, Agent, or Firm* — Frank R. Niranjan

(57) ABSTRACT

A heat dissipation device includes a heat sink and a pair of heat pipes fixed to the heat sink. The heat sink includes a rectangular post, four branches extending outwardly from four corners of the post, respectively, and a plurality of fins extending between the branches. Each heat pipe includes an evaporating section attached to a bottom of the post, a condensing section parallel to the evaporation section and attached to a top of the post, and an adiabatic section interconnecting the evaporating section and the condensing section. A block is secured to bottoms of the condensing sections of the heat pipes.

20 Claims, 4 Drawing Sheets

HEAT DISSIPATION DEVICE

BACKGROUND

1. Technical Field

The present invention relates to a heat dissipation device, and more particularly, to a heat dissipation device having a high heat dissipation capability.

2. Description of Related Art

Electronic components generate heat during operation. In order to ensure stable operation of the electronic components, the heat should be timely removed from the electronic components by some heat dissipation devices. A generally used heat dissipation device in the related art is so-called sunflower heat sink, which includes a solid post contacting the electronic components to absorb heat therefrom and a plurality of fins extending outwardly from the post to dissipate the heat from the post.

However, with development in technical, nowadays the electronic components operate in relatively high frequency, and thus generate heat much more than in the past. Such simple structure of the sunflower heat sink cannot satisfy the heat dissipation requirement of the electronic components any more. Therefore, many developments are applied to the heat sink to raise the heat dissipation capability thereof, one of which is to replace the original solid post with a hollow post containing coolant therein (generally called vapor chamber). Due to high heat conducting capability of the vapor chamber, heat can be rapidly transferred from the electronic components to the fins, thereby ensuring operation temperature of the electronic components within a preferable range. However, in contrast to the solid post, the cost of the vapor chamber is relatively high, causing the whole cost of the heat sink to be raised unexpectedly.

What is needed, therefore, is a heat dissipation device which can overcome the above-mentioned disadvantages.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
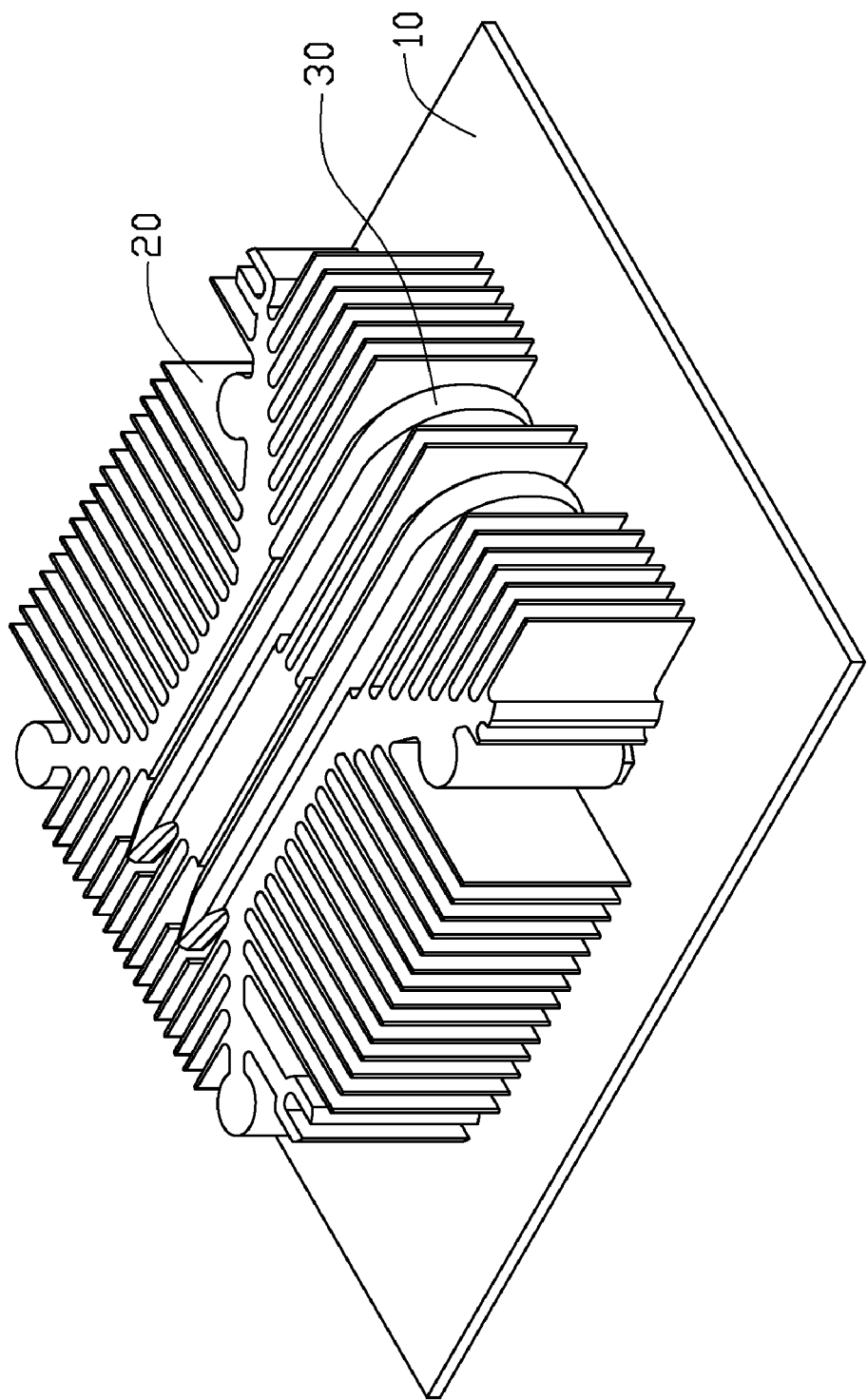
FIG. 1 is an assembled view of a heat dissipation device of the disclosure, wherein a printed circuit board having an electronic component mounted thereon is placed below the heat dissipation device.
Figure 2:
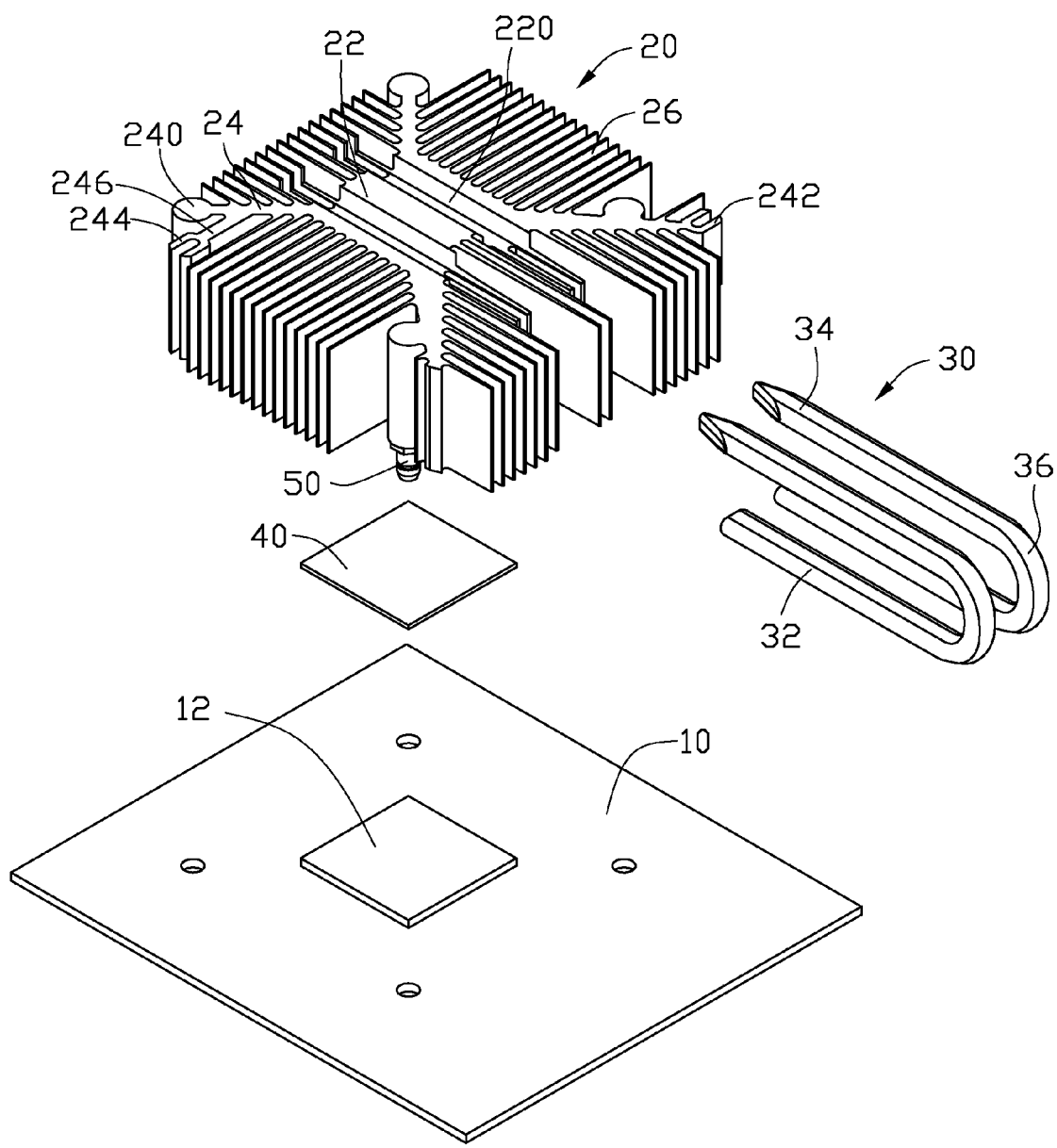
FIG. 2 is an exploded view of FIG. 1.

Referring to FIGS. 1-2, a heat dissipation device of the disclosure is presented. The heat dissipation device includes a heat sink 20 disposed on a printed circuit board 10, two heat pipes 30 retained in the heat sink 20, and a block 40 attached to a bottom of the heat sink 20 to contact with an electronic component 12 mounted on the printed circuit board 10.

Figure 4:
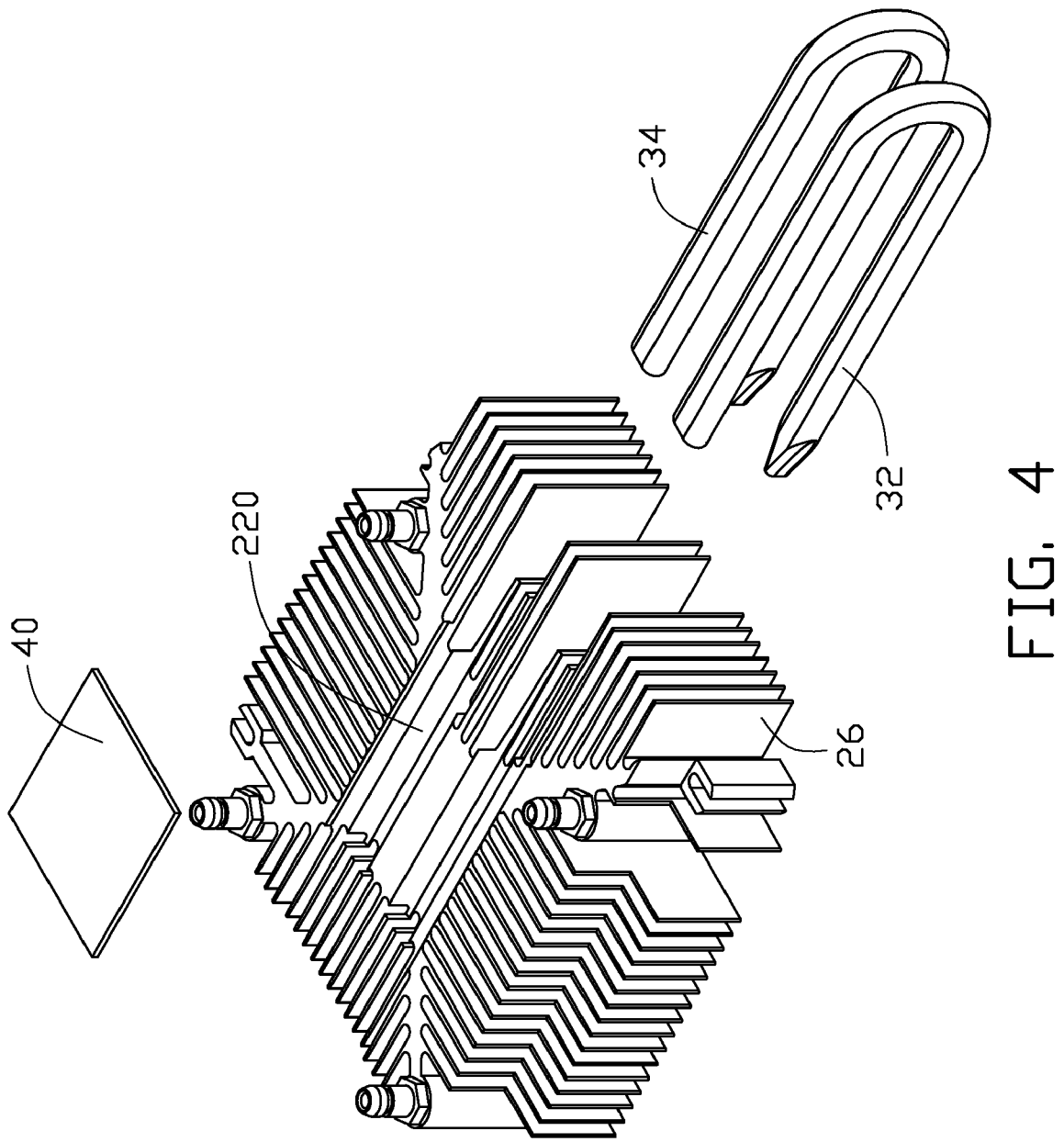
FIG. 4 is an exploded view of FIG. 3.

The heat sink 20 includes a central post 22 having a rectangular cross-section, four branches 24 extending outwardly, diagonally and horizontally from four corners of the post 22, and a plurality of fins 26 extending between the four branches 24, respectively. Referring also to FIG. 4, a pair of grooves 220 are defined in each of a top and a bottom faces of the post 22 along a front-rear direction of the heat sink 20. The four branches 24 divide a side face of the post 22 between the top and bottom faces into four portions which are located at four different sides (i.e., left and right sides and front and rear sides) of the post 22, and divide a space surrounding the side face of the post 22 into four identical areas. Each of the branches 24 has a column 240 formed therefrom, wherein two columns 240 are formed on two front branches 24 adjacent to distal ends thereof, while the other two columns 240 are formed on two rear branches 24 at distal ends thereof. The four columns 240 are parallel to each other and extended along a height of the heat sink 20. Each column 240 has a bore defined in a bottom face thereof, for allowing a fastener 50 to extend therein. Thereby, four fasteners 50 can be fixed to the bottom of the heat sink 20. The fasteners 50 are used for securely mounting the heat sink 20 to the printed circuit board 10, whereby the heat sink 20 can have an intimate contact with the electronic component 12. Two arms 242 are extended outwardly and horizontally from two of the four branches 24, wherein one arm 242 is formed on one front branch 24 at the distal end thereof, and the other arm 242 is formed on one rear branch 24 and located near the distal end thereof. The two arms 242 are substantially diagonally opposite to each other. Each arm 242 includes a U-shaped fork 244, into which another fastener can be inserted, thereby securing other elements (such as a fan) on the top of the heat sink 20. The front arm 242 has the fork 244 thereof directly coupling with the front branch 24, and the rear arm 242 has a plate 246 interconnecting the fork 244 thereof and the corresponding rear branch 24. The fins 26 in each area divided by the branches 24 are perpendicular to those in an adjacent area, and parallel to those in an opposite area. Front parts of the fins 26 in a front area and aligned with the grooves 220 are truncated so as to provide a space for receiving parts of the heat pipes 30.

The two heat pipes 30 have the same configuration, i.e., U-shaped configuration. Each heat pipe 30 includes a straight evaporation section 32, a straight condensing section 34 parallel to the evaporation section 32, and a curved adiabatic section 36 interconnecting the evaporation section 32 and the condensing section 34. The evaporation section 32 is longer than the adiabatic section 36, and shorter than the condensing section 34. The evaporation sections 32 of the heat pipes 30 are inserted into the two grooves 220 in the bottom face of the post 22, the condensing sections 34 of the heat pipes 30 are extended into the grooves 220 in the top face of the post 22, and the adiabatic sections 36 of the heat pipes 30 are located in front of the truncated fins 26. The evaporation sections 32 of the heat pipes 30 are perpendicular to the fins 26 located at a left and a right area beside the post 22 of the heat sink 20, and parallel to the fins 26 located at the front and a rear area in front and in rear of the post 22 of the heat sink 20.

Figure 3:
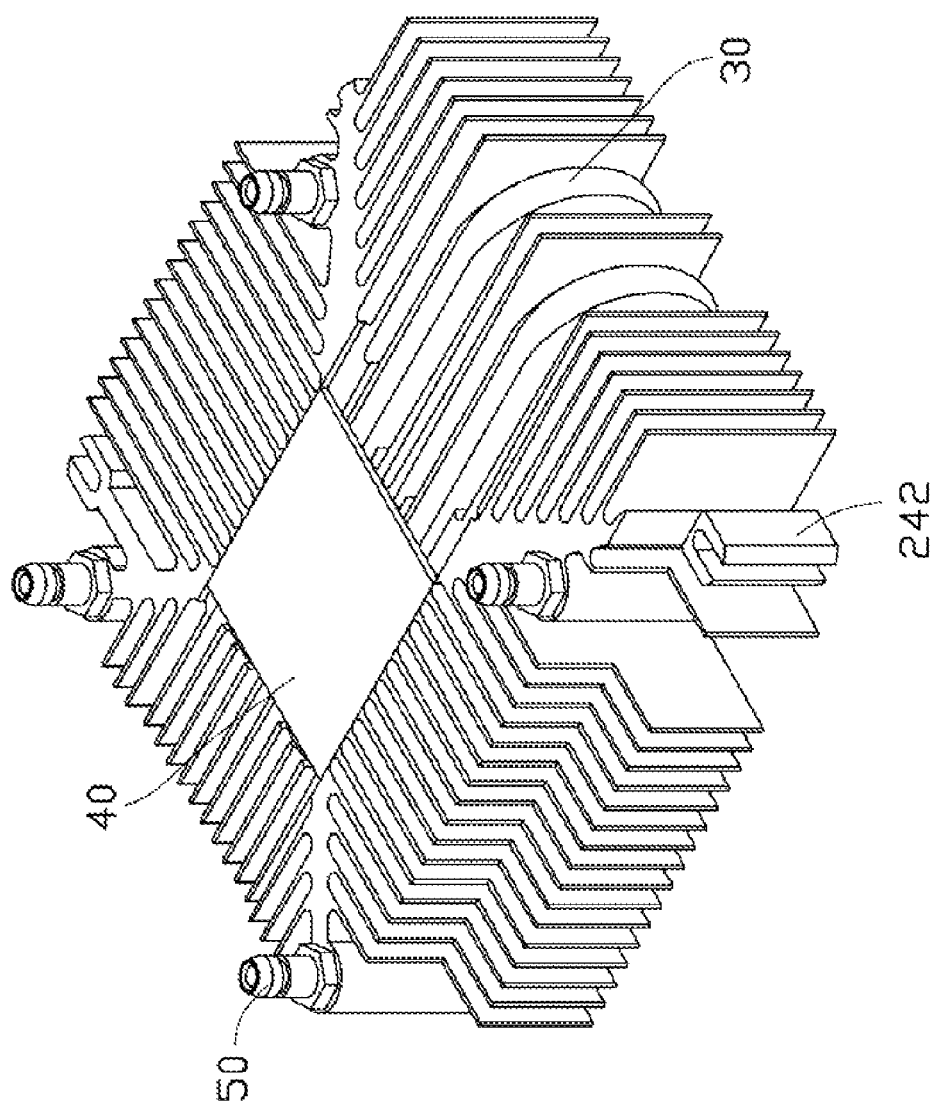
FIG. 3 is an inverted view of the heat dissipation device of FIG. 1.

The block 40 is attached to bottoms of the evaporation sections 32 of the heat pipes 30, as shown in FIG. 3. The block 40 has an area similar to the electronic component 12 as well as the cross-section of the post 22. Heat generated by the electronic component 12 can be conducted to the evaporation sections 32 of the heat pipes 30 via the block 40, and then to the bottom of the heat sink 20 via the evaporation sections 32 of the heat pipes 30, and to the top of the heat sink 20 via the condensing sections 34 of the heat pipes 30. Thus, the heat is uniformly and rapidly transferred over the whole heat sink 20, and a heat dissipation efficiency of the heat sink 20 is accordingly raised.

It is believed that the present disclosure and its advantages will be understood from the foregoing description, and it will be apparent that various changes may be made thereto without departing from the spirit and scope of the present disclosure or sacrificing all of its material advantages, the examples hereinbefore described merely being preferred or exemplary embodiments.

The invention claimed is:

1. A heat dissipation device comprising:
   a heat sink comprising a post, a plurality of branches and a plurality of fins, the plurality of branches and the plurality of fins extending outwardly from a side face of the post; and
   a heat pipe fixed to the heat sink, the heat pipe comprising two parallel sections respectively extending into a top and a bottom of the post, and a connecting section interconnecting the two parallel sections,
   wherein the post comprises four corners, and the plurality of branches comprises four branches, each of the four branches extend diagonally from a corner of the four corners of the post, and
   wherein the plurality of fins comprises four fin groups, each of the four fin groups located between two adjacent branches of the four branches.

2. The heat dissipation device as claimed in claim 1, wherein each of a top and a bottom of the post defines a groove, a first of the two parallel sections of the heat pipe being received in the groove in the top of the post and a second of the two parallel sections of the heat pipe being received in the groove in the bottom of the post.

3. The heat dissipation device as claimed in claim 1, wherein the two parallel sections have different lengths.

4. The heat dissipation device as claimed in claim 1, wherein some fins of the four fin groups located at two opposite sides of the post are perpendicular to the two parallel sections of the heat pipe, and other fins of the four fin groups located at another two opposite sides of the post are parallel to the two parallel sections of the heat pipe.

5. The heat dissipation device as claimed in claim 1, wherein the post has a rectangular cross-section.

6. The heat dissipation device as claimed in claim 1, wherein a column of four columns is formed on the each of the four branches, wherein two of the four columns are located at distal ends of two of the four branches, and another two of the four columns are located adjacent to distal ends of another two of the four branches.

7. The heat dissipation device as claimed in claim 6, wherein a fastener extends in a bottom of each column of the four columns for fastening the heat sink to a printed circuit board so that the heat sink can have an intimate contact with an electronic component mounted on the printed circuit board.

8. The heat dissipation device as claimed in claim 1, wherein two forks are formed on two diagonally opposite ones of the four branches, one of the two forks is directly connected to one of the two diagonally opposite ones of the four branches, and another one of the two forks is connected to another one of the two diagonally opposite ones of the four branches via a plate.

9. The heat dissipation device as claimed in claim 1, wherein a block is attached to the bottom of the post via one of the two parallel sections of the heat pipe.

10. The heat dissipation device as claimed in claim 9, wherein an area of the block is substantially the same as that of a cross section of the post.

11. A heat dissipation device comprising:
    a heat sink comprising a post, four branches and four fin groups, the four branches and the four fin groups extending outwardly from a side face of the post, each fin group of the four fin groups comprising a plurality of fins located between two adjacent branches of the four branches; and
    a heat pipe comprising an evaporating section, a condensing section parallel to the evaporating section, and an adiabatic section interconnecting the condensing section and the evaporating section;
    wherein the evaporating section and the condensing section of the heat pipe are fixed to a bottom face and a top face of the post, respectively, and the adiabatic section of the heat pipe is located in front of some of the plurality of fins of the four fin groups.

12. The heat dissipation device as claimed in claim 11, wherein the plurality of fins of one fin group of the four fin groups are perpendicular to those of an adjacent fin group of the four fin groups, and parallel to those of an opposite fin group of the four fin groups.

13. The heat dissipation device as claimed in claim 11, wherein the evaporation section of the heat pipe is perpendicular to the plurality of fins of one fin group of the four fin groups, and parallel to the plurality of fins of an adjacent fin group of the four fin groups.

14. The heat dissipation device as claimed in claim 11, wherein four columns are formed on the four branches, respectively, and two forks are formed on two diagonally opposite ones of the four branches, respectively.

15. The heat dissipation device as claimed in claim 11, wherein each of the top face and the bottom face of the post defines a groove therein, and the evaporating section being received in the groove in the bottom of the post and the condensing section of the heat pipe are received in the groove in the top of the post.

16. A heat dissipation device comprising:
    a heat sink comprising a post, a plurality of branches and a plurality of fin groups, the post comprising a top face, a bottom face and a side face between the top face and the bottom face, the plurality of branches and the plurality of fin groups extending outwardly from the side face of the post, and the plurality of branches and the plurality of fin groups alternating with each other, each of the plurality of fin groups comprising a plurality of fins; and
    a heat pipe fixed to the heat sink, the heat pipe comprising two parallel sections respectively attaching to the top face and the bottom face of the post, and a connecting section interconnecting the two parallel sections.

17. The heat dissipation device as claimed in claim 16, wherein the post has a rectangular cross-section, the rectangular cross-section forming four corners, the plurality of branches are four in number, and the plurality of fin groups are four in number, the plurality of branches respectively extending from the four corners of the post, and the each of the plurality of fin groups respectively extending from four different sides of the side face of the post.

18. The heat dissipation device as claimed in claim 17, wherein the plurality of fins of the each of the plurality of fin groups are parallel to each other, the plurality of fins of two of the plurality of fin groups at opposite sides of the post are perpendicular to the two parallel sections of the heat pipe, and the plurality of fins of another two of the plurality of fin groups located at another two opposite sides of the post are parallel to the two parallel sections of the heat pipe.

19. The heat dissipation device as claimed in claim 16, wherein the plurality of fins of one of the plurality of fin groups are perpendicular to the two parallel sections of the heat pipe, and the plurality of fins of another one of the plurality of the fin groups are parallel to the two parallel sections of the heat pipe.

20. The heat dissipation device as claimed in claim 16, wherein the plurality of fins of the each of the plurality of fin groups extend perpendicularly from a side of the side face of the post and are parallel to each other.

* * * * *